US012635201B2

(12) United States Patent
Liu et al.

(10) Patent No.: US 12,635,201 B2
(45) Date of Patent: May 19, 2026

(54) LOW-TEMPERATURE PROCESSING METHOD FOR IMPROVING 4H—SIC/SIO₂ INTERFACE BASED ON SUPERCRITICAL OXYNITRIDE AND USE THEREOF

(71) Applicant: XI'AN JIAOTONG UNIVERSITY, Xi'an (CN)

(72) Inventors: Weihua Liu, Xi'an (CN); Menghua Wang, Xi'an (CN); Li Geng, Xi'an (CN); Mingchao Yang, Xi'an (CN); Yue Hao, Xi'an (CN); Songquan Yang, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 645 days.

(21) Appl. No.: 18/170,477

(22) Filed: Feb. 16, 2023

(65) Prior Publication Data

US 2023/0197452 A1      Jun. 22, 2023

Related U.S. Application Data

(63) Continuation of application No. PCT/CN2021/118871, filed on Sep. 16, 2021.

(30) Foreign Application Priority Data

Aug. 17, 2020      (CN) .......................... 202010826629.7

(51) Int. Cl.
*H10D 62/832*        (2025.01)
(52) U.S. Cl.
CPC ................................ *H10D 62/8325* (2025.01)
(58) Field of Classification Search
CPC ............. H01L 21/02164; H01L 21/045; H01L 21/049; H01L 21/022; H01L 21/02126;
(Continued)

(56) References Cited

U.S. PATENT DOCUMENTS 4,875,083  A  *  10/1989  Palmour ................ H10D 64/62
                                                      257/E29.345
6,610,366  B2 *   8/2003  Lipkin ................... H10D 30/63
                                                      427/126.3
(Continued)

FOREIGN PATENT DOCUMENTS

CN            1552092  A      12/2004
CN          104966665  A      10/2015
(Continued)

OTHER PUBLICATIONS

"Low temperature defect passivation technology for semiconductor electronic devices—supercritical fluids treatment process" T.-C. Chang, P.-H. Chen, C.-Y. Lin, C.-C. Shih, in Materials Today Physics 14 (2020) 100225 (Year: 2020).*
(Continued)

*Primary Examiner* — Eric A. Ward

(57)        ABSTRACT

Disclosed are a low-temperature processing method for improving a 4H—SiC/SiO₂ interface based on a supercritical oxynitride, and use thereof. The method includes: performing standard cleaning on a silicon carbide sample to be processed; performing dry-oxygen oxidation on the cleaned silicon carbide sample to grow an oxide layer; placing the silicon carbide sample having the oxide layer on a support in a steady-state supercritical chamber; controlling a pressure and injecting nitrogen-oxygen gas into the supercritical device; increasing a temperature in the supercritical device from 23° C. to 500° C.; maintaining the above supercritical state until the processing ends; reducing a temperature of a reactor to room temperature after reaction ends, reducing the pressure to an atmospheric pressure, and taking out the reactor. The present disclosure allows for effective and quick decrease in the 4H—SiC/SiO₂ interface state density, and also a significant decrease in the processing temperature.

6 Claims, 2 Drawing Sheets

(58) Field of Classification Search
CPC .......... H01L 21/0214; H01L 21/02137; H01L
21/02134; H01L 21/02131; H01L
21/02129; H01L 21/02123; H01L
21/02343; H01L 21/02337; H01L
21/02318; H01L 21/02554; H01L
21/02332; H01L 21/02329; H01L
21/02323; H01L 21/02326; H01L
21/28255; H01L 21/3143; H01L 21/3144;
H01L 21/3145
See application file for complete search history.

(56) References Cited

U.S. PATENT DOCUMENTS 6,939,756 B1 * 9/2005 Chung ................ H01L 21/0214
438/285
8,071,458 B1 12/2011 Liu et al.

FOREIGN PATENT DOCUMENTS

| CN | 111199873 A | 5/2020 |
| CN | 111446154 A | 7/2020 |
| CN | 112151384 A | 12/2020 |

OTHER PUBLICATIONS

International Search Report dated Dec. 14, 2021 in International Application No. PCT/CN2021/118871. English translation attached.
First Office Action from corresponding Chinese Application No. 202010826629.7 dated Jun. 23, 2021. English translation attached.
The Grant Notice from corresponding Chinese Application No. 202010826629.7 dated Jan. 12, 2022. English translation attached.
Amna Siddiqui, et al. "The Current Status and the Future Prospects of Surface Passivation in 4H—SiC Transistors" IEEE Transactions on Device and Materials Reliability, 2016.16(3), Sep. 1, 2016, (Sep. 1, 2020).

* cited by examiner

Heating system

LOW-TEMPERATURE PROCESSING METHOD FOR IMPROVING 4H—SIC/SIO$_2$ INTERFACE BASED ON SUPERCRITICAL OXYNITRIDE AND USE THEREOF

CROSS-REFERENCE TO RELATED APPLICATIONS

This application is a continuation of International Application No. PCT/CN2021/118871, filed on Sep. 16, 2021, which claims priority to Chinese Patent Application No. 202010826629.7 filed on Aug. 17, 2020, the entire disclosure of which is incorporated herein by reference.

FIELD

The present disclosure belongs to the technical field of third-generation wide bandgap semiconductor materials, and more particularly, to a low-temperature processing method for improving a 4H—SiC/SiO$_2$ interface based on a supercritical oxynitride and use thereof.

BACKGROUND

Silicon carbide (SiC) has many excellent characteristics as a typical third-generation wide bandgap semiconductor. Compared with common Si, a SiC device has characteristics such as high-pressure resistance, high frequency resistance, high temperature resistance, and high service life. Thus, the SiC device can be widely used in the frontier science and technology fields of rail traffics, new energy vehicles, photovoltaic inverters, renewable energy power generations, military industry and national defense, and the like. Currently, SiC MOSFET with high operating frequency and low on-resistance has a broad application prospect in the field of high-power devices. However, the widespread commercialization of the SiC MOSFET is still relatively slow. Reliability of the SiC device is the key for limiting further expansion of the application fields. In general, channel mobility of the SiC MOSFET is only about 5% of mobility of a bulk material, and the low channel mobility is mainly due to high interface state density and oxide charges density of SiO$_2$/SiC, especially an interface state density of SiO$_2$/4H—SiC is nearly two orders of magnitude higher than that of a SiO$_2$/Si interface. The higher interface state density may result in problems such as reduced reverse channel mobility to be reduced, slow switching speed, increased leakage current, increased threshold voltage. Interface quality has become a main factor for limiting the performance of the SiC device. Therefore, a method for reducing an interface state has become the focus of SiC device research.

In order to reduce an interface state density of 4H—SiC/SiO$_2$ and improve mobility of the SiC MOSFET, researchers have made various attempts. At present, an annealing process after oxidation is mainly used to reduce the interface state density of 4H—SiC/SiO$_2$ and improve characteristics of a MOS interface. A conventional thermal annealing temperature ranges from 1000° C. to 1500° C. The interface state density of 4H—SiC/SiO$_2$ is often reduced in a nitrogen-oxygen or POCl$_3$ gas atmosphere. For example, NO annealing is performed at 1150° C. after high-temperature oxidation, which enables an interface state density near Ec in a 4H—SiC/SiO$_2$ MOS device to be significantly reduced, and a possible explanation of passivation effect of bonding between an N atom and a C atom and a C cluster is proposed. However, NO is a harmful gas with a higher hazard factor to health. Therefore, for safety reasons, N$_2$O is preferable to NO because N$_2$O has less operational requirements. In recent years, researches on the reduction of the interface state by N$_2$O annealing at a high temperature emerge in endlessly. It has been proved that high-temperature annealing at a temperature of 1100° C. in an N$_2$O atmosphere can significantly reduce an interface state density at 0.2 eV away from a conduction band. Also, it is proposed that the interface state density is reduced because the N atom can not only passivate a Si dangling bond to form a Si—N bond, but also form a C—N bond with the C atom in C cluster to reduce defects caused by dry-oxygen oxidation. However, N$_2$O is unstable at a high temperature and is decomposed into NO, O$_2$, and N$_2$, and the interface state density is reduced mainly dependent on NO. Further, O$_2$ released by N$_2$O in a high-temperature environment may reoxidize an oxide layer and prevent N from entering the oxide layer and the interface. Moreover, reoxidation may generate new defects on the interface. Therefore, an annealing effect of N$_2$O is not as good as that of NO.

In addition to annealing at the high temperature in the nitrogen-oxygen-containing gas atmosphere, annealing in a POCl$_3$ atmosphere can also effectively reduce the interface state density. After the annealing, channel mobility of transverse 4H—SiC MOSFETs is close to 90 cm$^2$/(V·s), and an improving effect of the mobility is significantly better than NO processing. However, POCL$_3$ annealing may result in a negative shift of a device threshold, and reliability of the oxide layer will be reduced.

In order to improve the interface quality, the researchers used ultra-high temperature argon (Ar) annealing (at a temperature about 1300° C. to 1500° C.) to reduce the interface state density. However, after high-temperature pure Ar annealing, a higher leakage current was observed even at very low electric fields (<0.2 mV/cm).

In addition, the high-temperature annealing can reduce stability of the device and lead to additional leakage current. Therefore, it is necessary to find a low-temperature processing method to obtain a high-quality interface.

SUMMARY

In order to overcome defects in the related art, the technical problem to be solved by the present disclosure is to provide a low-temperature processing method for improving a 4H—SiC/SiO$_2$ interface based on a supercritical oxynitride and use thereof. In order to solve problems such as high interface state density of SiO$_{2/4}$H—SiC and low mobility of 4H—SiC MOSFET in the related art, a method for preparing a 4H—SiC MOS device with high interface quality and carrier mobility without high temperature is provided, which is simple and convenient to be operated.

According to the present disclosure, the following technical solutions are adopted.

In a first aspect, the present disclosure provides a low-temperature processing method for improving a 4H—SiC/SiO$_2$ interface based on a supercritical oxynitride. The method includes: step S1 of placing a silicon carbide sample with an oxide layer into a steady-state supercritical chamber to ensuring the silicon carbide sample is vertical; step S2 of sealing the steady-state supercritical chamber, injecting nitrogen-oxygen gas into the steady-state supercritical chamber, and controlling an initial pressure; step S3 of performing temperature- and pressure-increasing processing on the steady-state supercritical chamber; and step S4 of maintaining a temperature and a pressure at which the temperature- and pressure-increasing processing in step S3 is performed until reaction completes, and reducing the pressure to atmospheric pressure and taking out the sample, to complete low-temperature processing.

In a second aspect, the present disclosure provides use of a capacitor device processed by the low-temperature processing method for improving the $4H$—$SiC/SiO_2$ interface based on the supercritical oxynitride in aerospace, detection sensing, and new energy vehicle.

In a third aspect, the present disclosure provides a $4H$—$SiC$ MOS capacitor device, prepared by the method as described above. The $4H$—$SiC$ MOS capacitor device has an interface state density ranging from $1\times10^{11}$ eV$^{-1}$ cm$^{-2}$ to $1\times10^{12}$ eV$^{-1}$ cm$^{-2}$, a breakdown electric field ranging from 10 MV/cm to 13 MV/cm, and a gate-oxide leakage current density ranging from $1\times10^{-10}$ A·cm$^{-2}$ to $1\times10^{-8}$ A·cm$^{-2}$.

In a fourth aspect, the present disclosure provides a $4H$—$SiC$ MOSFET device prepared by the method as described above.

Compared with the related art, the present disclosure at least has the following beneficial effects.

In the low-temperature processing method for improving a $4H$—$SiC/SiO_2$ interface based on a supercritical oxynitride of the present disclosure, only the device is placed into the chamber and then introduce reactant gas, which provides simple and convenient operation, achieves improvement of the $SiO_{2/4}H$—$SiC$ interface at the high pressure and the treatment temperature only ranging from 50° C. to 500° C. Therefore, it is simple and convenient to operate. Further, it is possible to effectively reduce a process temperature, and also improve quality of the oxide layer and the interface.

Further, the reactor is brought into the initial pressure ranging from 5 MPa to 25 MPa, and then the temperature in the reactor is increased to accordingly increase the pressure. Therefore, it is possible to ensure that the reaction is rapidly and effectively carried out while ensuring the whole system can reach the supercritical state.

Further, the used nitrogen-oxygen gas includes $N_2O$ and NO, and other gases include $O_2$ and $N_2$, which can passivate defects of the $SiO_{2/4}H$—$SiC$ interface more effectively, and improve the interface quality.

Further, in a supercritical state at which the temperature ranges from 50° C. to 500° C. and the pressure ranges from 10 MPa to 100 MPa, the nitrogen-oxygen gas may not be decomposed in the supercritical state, and not be oxidized for the second time, thereby reducing generation of additional defects.

Further, in the supercritical state, the treatment is performed for 1 hour to 5 hours, so as to ensure that passivation reaction can be performed completely and thoroughly under different supercritical treatment conditions.

Further, due to the reduction of the interface state density of $SiO_{2/4}H$—$SiC$, mobility of the prepared $4H$—$SiC$ MOS capacitor device and mobility of $4H$—$SiC$ MOSFET device can be improved, and the quality of the oxide layer is improved. Therefore, a foundation is laid for further preparing the SiC MOSFET with high-performance.

In conclusion, the present disclosure not only can effectively reduce the interface state density, but also can significantly reduce the process temperature. Compared with the traditional high-temperature (above 1000° C.) oxynitride annealing process, the method has the advantages that the reaction temperature is low, the nitrogen-oxygen gas may not be decomposed in the supercritical state and avoids secondary oxidation, and the generation of additional defects is reduced. Moreover, a supercritical fluid has a large reaction density, which can not only quickly and efficiently reduce the interface state in the supercritical state, but also improve the quality of the oxide layer.

Wherein: 1, reactor; 2, first Omega K-type thermocouple; 3, second Omega K-type thermocouple; 4, Eurotherm temperature control instrument; 5, SCR temperature controller; 6, thermal insulation layer; 7, explosion valve; 8, pressure gauge; 9, high-pressure valve.

DETAILED DESCRIPTION

A state of a substance will change at different temperatures and pressure, and different states such as liquid, gas, and solid will appear. At a specific temperature and pressure, disappearance of a liquid-gas interface occurs, and this point is referred to as a critical point. A supercritical fluid refers to a fluid in which the substance is in a region at a temperature and pressure above the critical point. The supercritical fluid has unique physicochemical properties. For example, the supercritical fluid has a density close to that of the liquid, a viscosity close to that of the gas, a large diffusion coefficient, a small viscosity, and a large dielectric constant.

The present disclosure provides a low-temperature processing method for improving a $4H$—$SiC/SiO_2$ interface based on a supercritical oxynitride and use thereof. A trap in a $SiO_2/4H$—$SiC$ interface is passivated at a processing temperature of 50° C. to 500° C., so as to avoid problems caused by the above-mentioned high-temperature processing. Since a supercritical fluid (SCF) state is a particular substance phase with the coexistence of liquid and gas phases, a supercritical nitrogen-oxygen environment has advantages of gas-like high solubility and liquid-like permeability. Therefore, a supercritical nitrogen-oxygen fluid is allowed to enter an oxide and an interface to passivate an oxide layer trap and an interface state at a low temperature, thereby improving interface quality and enhancing mobility of the SiC MOSFET.

According to the present disclosure, a low-temperature processing method for improving a $4H$—$SiC/SiO_2$ interface based on a supercritical oxynitride is provided, and includes the flowing steps.

At step 1, a silicon carbide sample with an oxide layer is placed into a steady-state supercritical chamber to ensure the silicon carbide sample is vertical.

Figure 1:
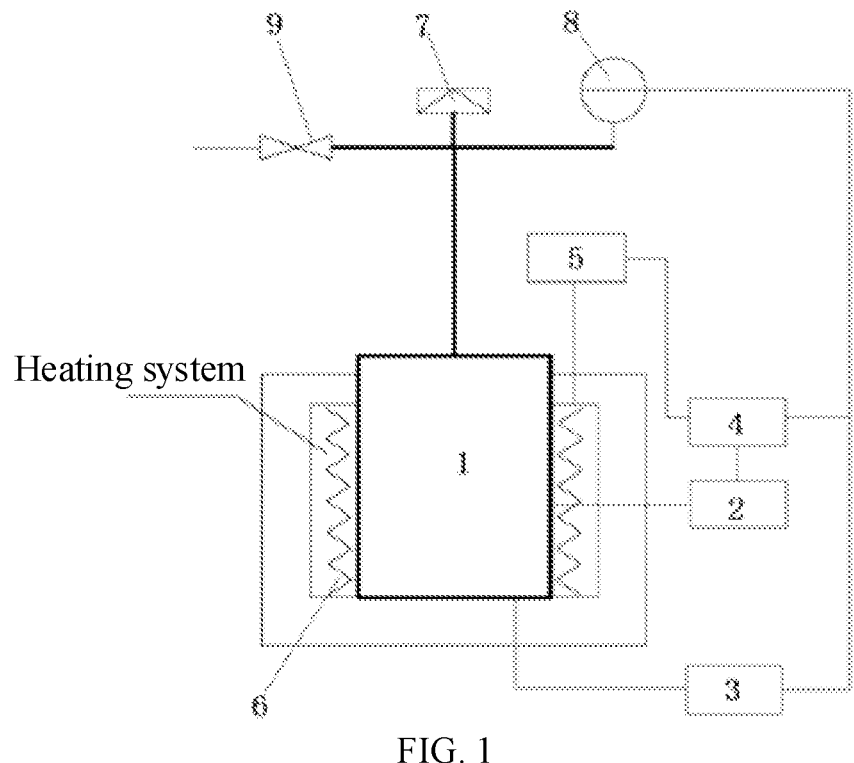
FIG. 1 is a schematic diagram of a supercritical experimental device.

Referring to FIG. 1, the steady-state supercritical chamber includes a reactor 1. A first Omega K-type thermocouple 2 and a second Omega K-type thermocouple 3 are disposed on a side surface and a bottom surface of the reactor 1, respectively. A thermal insulation layer 6 is arranged outside the reactor 1. A heating system is arranged in the thermal insulation layer 6. The first Omega K-type thermocouple 2 and the second Omega K-type thermocouple 3 are connected to an SCR temperature controller 5 by a Eurotherm temperature control instrument 4, respectively, and perform temperature display through the Eurotherm temperature control instrument 4. The SCR temperature controller 5 is connected to the heating system and is configured to control a heating and adiabatic resistor to heat a body of the reactor 1. A flange of the reactor 1 is provided with a high-pressure pipeline. The high-pressure pipeline is connected to an explosion valve 7, a pressure gauge 8, and a high-pressure valve 9.

At step 2, the steady-state supercritical chamber is sealed. The reactor is filled with nitrogen-oxygen gas no less than 10%, such as $N_2O$ and NO gases, and other gases include, but are not limited to, $O_2$ and $N_2$ gases, and an initial pressure ranges from 5 MPa to 25 MPa.

At step 3, a temperature of the supercritical reactor is raised to 50° C. to 500° C., and pressure in the supercritical chamber is increased to 10 MPa to 100 MPa.

At step 4, a treatment is performed for 1 hour to 5 hours in a supercritical state in which the temperature ranges from 50° C. to 500° C. and the pressure ranges from 10 MPa to 100 MPa, the pressure is reduced to the atmospheric pressure, and then the sample is taken out.

A 4H—SiC MOS capacitor device is provided, which has an interface state density ranging from $1 \times 10^{11}$ $eV^{-1}$ $cm^{-2}$ to $1 \times 10^{12}$ $eV^{-1}$ $cm^{-2}$, a breakdown electric field ranging from 10 MV/cm to 13 MV/cm, and a gate-oxide leakage current density ranging from $1 \times 10^{-10}$ $A \cdot cm^{-2}$ to $1 \times 10^{-8}$ $A \cdot cm^{-2}$. Thus, the 4H—SiC MOS capacitor device has a broad application prospect in aspects of aerospace, detection sensing, new energy vehicle, and the like.

Embodiment 1

A low-temperature processing method for improving a 4H—SiC/$SiO_2$ interface based on a supercritical oxynitride includes: step S1 of placing a silicon carbide sample with an oxide layer into a support of a supercritical device to ensure the silicon carbide sample is vertical; step S2 of sealing the supercritical device and injecting 70% $N_2O$ and 30% $O_2$ into the supercritical device to enable an initial pressure in the supercritical device to reach 5 MPa; step S3 of raising a temperature in the supercritical device to 50° C. and increasing a pressure in the supercritical device to 10 MPa; and step S4 of performing a treatment for 1 hour in a supercritical state in which the temperature is 50° C. and the pressure is 10 MPa, reducing the pressure to an atmospheric pressure, and taking out the sample.

Embodiment 2

A low-temperature processing method for improving a 4H—SiC/$SiO_2$ interface based on a supercritical oxynitride includes: step S1 of placing a silicon carbide sample with an oxide layer into a support of a supercritical device to ensure the silicon carbide sample is vertical; step S2 of sealing the supercritical device and injecting 70% $N_2O$ and 30% $N_2$ into the supercritical device to enable an initial pressure in the supercritical device to reach 10 MPa; step S3 of raising a temperature in the supercritical device to 100° C. and increasing a pressure in the supercritical device to 40 MPa; and step S4 of performing a treatment for 2 hours in a supercritical state in which the temperature is 100° C. and the pressure is 40 MPa, reducing the pressure to an atmospheric pressure, and taking out the sample.

Embodiment 3

A low-temperature processing method for improving a 4H—SiC/$SiO_2$ interface based on a supercritical oxynitride includes: step S1 of placing a silicon carbide sample with an oxide layer into a support of a supercritical device to ensure the silicon carbide sample is vertical; step S2 of sealing the supercritical device and injecting 70% $N_2O$ and 30% $N_2$ into the supercritical device to enable an initial pressure in the supercritical device to reach 15 MPa; step S3 of raising a temperature in the supercritical device to 250° C. and increasing a pressure in the supercritical device to 60 MPa; and step S4 of performing a treatment for 3 hours in a supercritical state in which the temperature is 250° C. and the pressure is 60 MPa, reducing the pressure to an atmospheric pressure, and taking out the sample.

Embodiment 4

A low-temperature processing method for improving a 4H—SiC/$SiO_2$ interface based on a supercritical oxynitride includes: step S1 of placing a silicon carbide sample with an oxide layer into a support of a supercritical device to ensure the silicon carbide sample is vertical; step S2 of sealing the supercritical device and injecting 100% $N_2O$ into the supercritical device to enable an initial pressure in the supercritical device to reach to 20 MPa; step S3 of raising a temperature in the supercritical device to 350° C. and increasing a pressure in the supercritical device to 80 MPa; and step S4 of performing a treatment for 4 hours in a supercritical state in which the temperature is 350° C. and the pressure is 80 MPa, reducing the pressure to an atmospheric pressure, and taking out the sample.

Embodiment 5

A low-temperature processing method for improving a 4H—SiC/$SiO_2$ interface based on a supercritical oxynitride includes: step S1 of placing a silicon carbide sample with an oxide layer into a support of a supercritical device to ensure the silicon carbide sample is vertical; step S2 of sealing the supercritical device and injecting 100% $N_2O$ into the supercritical device to enable an initial pressure in the supercritical device to reach to 25 MPa; step S3 of raising a temperature in the supercritical device to 500° C. and increasing a pressure in the supercritical device to 100 MPa; and step S4 of performing a treatment for 5 hours in a supercritical state in which the temperature is 500° C. and the pressure is 100 MPa, reducing the pressure to an atmospheric pressure, and taking out the sample.

According to the present disclosure, improvement effects of different oxynitrides on the interface are fully considered, an optimal supercritical formula is finally obtained according to different supercritical processing effects, and the mobility of the 4H—SiC MOSFET is improved.

According to the present disclosure, an n-type 4H—SiC semiconductor material is subjected to standard cleaning and then subjected to high-temperature oxidation, and then placed into the reactor, and the nitrogen-oxygen gas is injected into the reactor. A temperature rise brings the nitrogen-oxygen gas in a supercritical state, and the pressure increases with the increasing of the temperature. After a predetermined processing temperature ranging from 50° C. to 500° C. and a pressure ranging from 10 MPa to 100 MPa are reached, the supercritical state is maintained until the reaction is ended; and the temperature is reduced until the pressure is reduced to the atmospheric pressure, and a processed sample is taken out.

Figure 2:
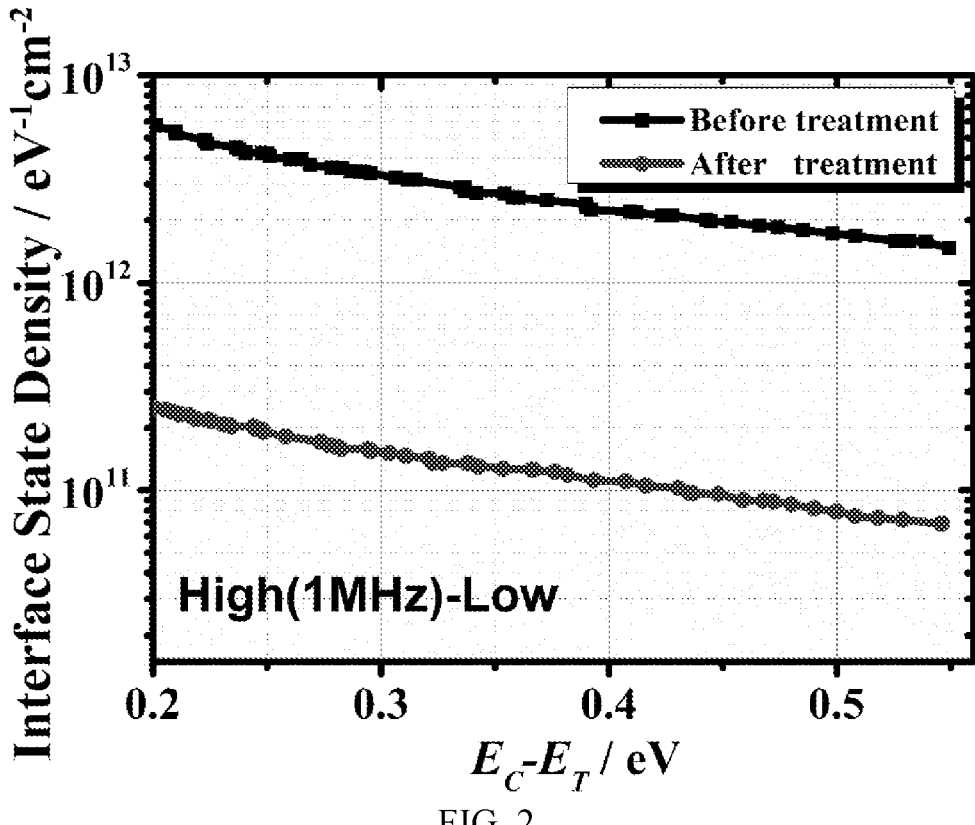
FIG. 2 is a graph showing result of an interface state density before and after a supercritical oxynitride treatment.
Figure 3:
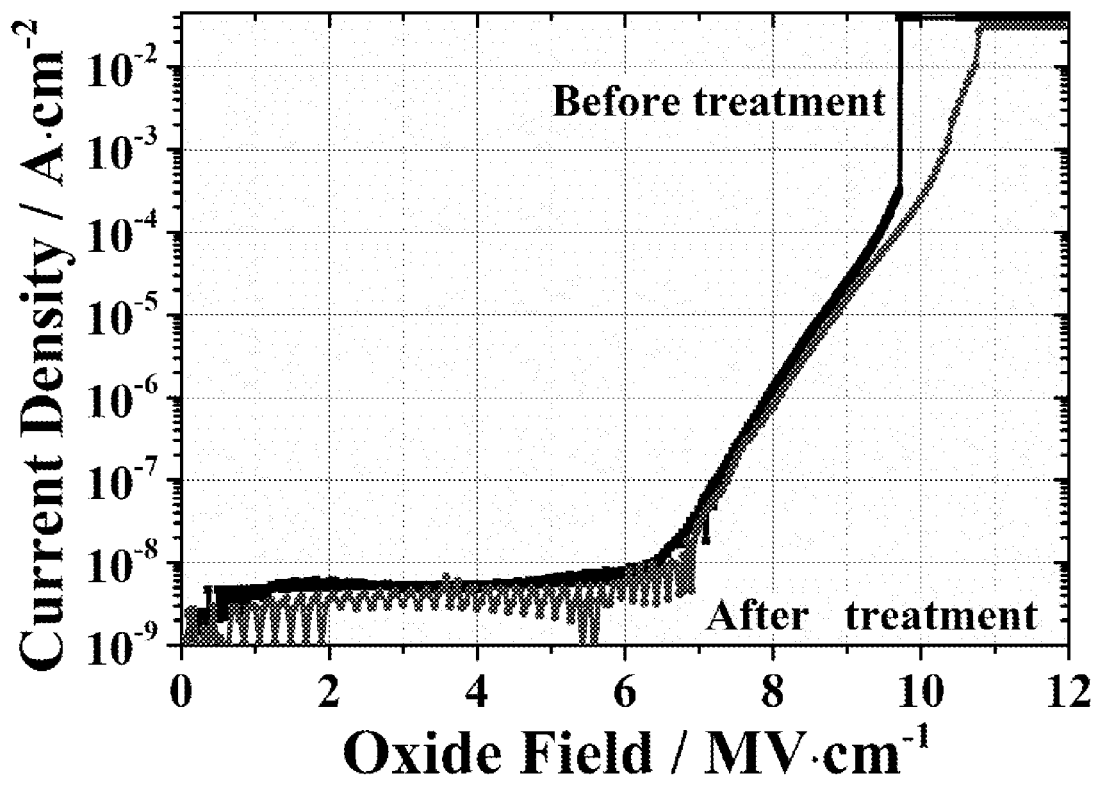
FIG. 3 is a graph showing result of a breakdown electric field before and after the supercritical oxynitride treatment.

Referring to FIG. 2 and FIG. 3, treatment performed by the supercritical nitrogen-oxygen gas can quickly and efficiently reduce the interface state density of $SiO_{2/4}H$—SiC in the low-temperature environment, improve the quality of the oxide layer, and increase the mobility of the 4H—SiC MOSFET. According to experimental data mapping, it can be seen from FIG. 2 that the interface state density is reduced by more than one order of magnitude. In addition, it can be seen from FIG. 3 that a breakdown electric field of the processed device is increased from 9.7 mV/cm to 10.8 mV/cm.

In summary, the present disclosure provides a low-temperature processing method for improving a $4H$—$SiC/SiO_2$ interface based on a supercritical oxynitride, which can quickly and efficiently reduce the interface state density of $SiO_{2/4}H$—$SiC$ in the low-temperature environment, improve the quality of the oxide layer, and increase the mobility of the $4H$—$SiC$ MOSFET.

What is claimed is:

1. A low-temperature processing method for improving a $4H$—$SiC/SiO_2$ interface based on a supercritical oxynitride, the method comprising:

step S1 of placing a silicon carbide sample with an oxide layer into a steady-state supercritical chamber;

step S2 of sealing the steady-state supercritical chamber and injecting nitrogen-oxygen gas into the steady-state supercritical chamber, and controlling an initial pressure;

step S3 of performing temperature- and pressure-increasing processing on the steady-state supercritical chamber; and step S4 of maintaining a temperature and a pressure at which the temperature- and pressure-increasing processing is performed in step S3 until reaction completes, reducing the pressure to an atmospheric pressure, and taking out the sample, to complete low-temperature processing, wherein in step S2, a content of the nitrogen-oxygen gas is greater than or equal to 10% of a volume of a reactor of the steady-state supercritical chamber, and the initial pressure ranges from 5 MPa to 25 MPa.

2. The method according to claim 1, wherein the nitrogen-oxygen gas contains $N_2O$ and NO, and the remaining gas in the reactor of the steady-state supercritical chamber contains $O_2$ and $N_2$ from atmosphere.

3. The method according to claim 1, wherein in step S3, the steady-state supercritical chamber has a temperature ranging from 50° C. to 500° C. and an initial pressure ranging from 10 MPa to 100 MPa.

4. The method according to claim 1, wherein in step S4, a reaction time in a supercritical state is 1 hour to 5 hours.

5. The method according to claim 1, wherein the low-temperature processed $4H$—$SiC/SiO_2$ has an interface state density ranging from $1 \times 10^{11}$ $eV^{-1}cm^{-2}$ to $1 \times 10^{12}$ $eV^{-1}$ $cm^{-2}$, a breakdown electric field ranging from 10 MV/cm to 13 MV/cm, and a gate-oxide leakage current density ranging from $1 \times 10^{-10}$ $A \cdot cm^{-2}$ to $1 \times 10^{-8}$ $A \cdot cm^{-2}$.

6. A low-temperature processing method for improving a $4H$—$SiC/SiO_2$ interface based on a supercritical oxynitride, the method comprising:

performing high-temperature oxidation on an n-type $4H$—$SiC$ semiconductor material after standard cleaning, and then placing the n-type $4H$—$SiC$ semiconductor material into a reactor of a steady-state supercritical chamber, and injecting nitrogen-oxygen gas into the reactor;

bringing the nitrogen-oxygen gas into a supercritical state by increasing a temperature, wherein a pressure in the reactor increases with an increase of the temperature;

maintaining the supercritical state when a predetermined processing temperature of 50° C. to 500° C. and a predetermined pressure of 10 MPa to 100 MPa are reached, until a reaction ends; and lowering the temperature until the pressure is reduced to an atmospheric pressure, and taking out a processed sample, wherein a content of the nitrogen-oxygen gas is greater than or equal to 10% of a volume of the reactor of the steady-state supercritical chamber, and an initial pressure in the reactor ranges from 5 MPa to 25 MPa.

\* \* \* \* \*